United States Patent
Jain et al.

(10) Patent No.: US 10,797,197 B2
(45) Date of Patent: Oct. 6, 2020

(54) THIN-FILM, FLEXIBLE OPTOELECTRONIC DEVICES INCORPORATING A SINGLE LATTICE-MATCHED DILUTE NITRIDE JUNCTION AND METHODS OF FABRICATION

(71) Applicant: ALTA DEVICES, INC., Sunnyvale, CA (US)

(72) Inventors: Nikhil Jain, Sunnyvale, CA (US); Brendan M. Kayes, Los Gatos, CA (US); Gang He, Cupertino, CA (US)

(73) Assignee: ALTA DEVICES, INC., Sunnyvale, CA (US)

(*) Notice: Subject to any disclaimer, the term of this patent is extended or adjusted under 35 U.S.C. 154(b) by 0 days.

(21) Appl. No.: 16/011,531

(22) Filed: Jun. 18, 2018

(65) Prior Publication Data

US 2019/0386169 A1 Dec. 19, 2019

(51) Int. Cl.
| H01L 21/00 | (2006.01) |
| H01L 31/18 | (2006.01) |
| H01L 31/0216 | (2014.01) |
| H01L 31/0232 | (2014.01) |
| H01L 31/0687 | (2012.01) |
| H01L 31/0725 | (2012.01) |

(Continued)

(52) U.S. Cl.
CPC .... *H01L 31/1844* (2013.01); *H01L 31/02168* (2013.01); *H01L 31/02327* (2013.01); *H01L 31/0687* (2013.01); *H01L 31/0725* (2013.01); *H01L 31/0735* (2013.01); *H01L 31/206* (2013.01); *H01L 33/007* (2013.01); *H01L 21/02304* (2013.01)

(58) Field of Classification Search
CPC .......... H01L 31/1848; H01L 31/07168; H01L 31/02327
USPC .......................................................... 438/94
See application file for complete search history.

(56) References Cited

U.S. PATENT DOCUMENTS

| 8,451,875 B2 * | 5/2013 | Johnson | H01S 5/18308 372/43.01 |
| 8,865,489 B2 * | 10/2014 | Rogers | H01L 25/0753 438/27 |

(Continued)

FOREIGN PATENT DOCUMENTS

WO 2017132534 A1 8/2017

OTHER PUBLICATIONS

Jones-Albertus, R., et al., "Using Dilute Nitrides to Achieve Record Solar Cell Efficiencies," Mater.Res Soc.Symp. Proc. vol. 1538, Materials Research Society, pp. 161-166, 2013.

(Continued)

*Primary Examiner* — David S Blum
(74) *Attorney, Agent, or Firm* — Arent Fox, LLP (57) ABSTRACT

A thin film, flexible optoelectronic device is described. In an aspect, a method for fabricating a single junction optoelectronic device includes forming a p-n structure on a substrate, the p-n structure including a semiconductor having a lattice constant that matches a lattice constant of substrate, the semiconductor including a dilute nitride, and the single-junction optoelectronic device including the p-n structure; and separating the single-junction optoelectronic device from the substrate. The dilute nitride includes one or more of GaInNAs, GaInNAsSb, alloys thereof, or derivatives thereof.

24 Claims, 5 Drawing Sheets

(51) Int. Cl.
*H01L 31/0735* (2012.01)
*H01L 31/20* (2006.01)
*H01L 33/00* (2010.01)
*H01L 21/02* (2006.01)

(56) References Cited

U.S. PATENT DOCUMENTS

| | | | | |
|---|---|---|---|---|
| 2008/0023067 | A1* | 1/2008 | Hu | B82Y 10/00 136/256 |
| 2012/0037930 | A1* | 2/2012 | Hoppel | H01L 33/0079 257/88 |
| 2013/0118566 | A1* | 5/2013 | Jones-Albertus | H01L 31/06 136/255 |
| 2014/0076387 | A1* | 3/2014 | King | H01L 31/0725 136/255 |
| 2014/0261611 | A1* | 9/2014 | King | H01L 31/0352 136/244 |
| 2015/0221803 | A1 | 8/2015 | Arias | |
| 2017/0025484 | A1* | 1/2017 | Forrest | H01L 51/56 |
| 2017/0092800 | A1* | 3/2017 | Derkacs | H01L 31/078 |
| 2017/0110613 | A1* | 4/2017 | Suarez | H01L 31/03048 |
| 2017/0130363 | A1* | 5/2017 | Iyer | C09K 11/7492 |
| 2017/0338357 | A1* | 11/2017 | Liu | H01L 31/03042 |
| 2018/0047627 | A1* | 2/2018 | Forrest | H01L 21/7813 |
| 2018/0366609 | A1* | 12/2018 | Ritenour | H01L 31/1844 |
| 2019/0013430 | A1* | 1/2019 | Jones-Albertus | H01L 31/0687 |

OTHER PUBLICATIONS

International Search Report and Written Opinion corresponding to International Application No. PCT/US2019/023607, dated May 29, 2019.

Miyashita, N., et al., "Enhancement of photocurrent in epitaxial lift-off thin-film GaInNAsSb solar cells due to light-confinement structure", The Japan Society of Applied Physics, Applied Physics Express, vol. 11, pp. 0723011-0723014, Jun. 8, 2018.

Ochoa, M., et al., "Advances Towards 4J Lattice-Matched including Dilute Nitride Subcell for Terrestrial and Space Application", IEEE, pp. 52-57, 2016.

* cited by examiner

THIN-FILM, FLEXIBLE OPTOELECTRONIC DEVICES INCORPORATING A SINGLE LATTICE-MATCHED DILUTE NITRIDE JUNCTION AND METHODS OF FABRICATION

CROSS-REFERENCE TO RELATED APPLICATION

The present application is related to U.S. patent application titled "THIN-FILM, FLEXIBLE MULTI-JUNCTION OPTOELECTRONIC DEVICES INCORPORATING LATTICE-MATCHED DILUTE NITRIDE JUNCTIONS AND METHODS OF FABRICATION," filed herewith, the content of which is incorporated herein by reference in its entirety.

BACKGROUND OF THE DISCLOSURE

Aspects of the present disclosure generally relate to optoelectronic devices, and more particularly to thin-film, flexible optoelectronic devices incorporating a single lattice-matched dilute nitride junction and methods of fabricating the optoelectronic devices.

There is a need for providing optoelectronic devices (e.g., photovoltaic cells) that have more targeted and improved energy-capture efficiency when compared to the efficiency of conventional optoelectronic devices. These improved devices need to be, however, cost effective, easily implemented and/or adaptable to existing environments. Achieving better flexibility and lightweight designs are also highly desirable. The present disclosure describes various aspects of technical solutions that address such needs.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

This disclosure describes thin-film, flexible optoelectronic devices incorporating a single lattice-matched dilute nitride junction and methods of fabricating the optoelectronic devices. For example, the disclosure describes various aspects of a solar cell design using dilute nitrides that can be grown lattice-matched to a GaAs substrate or a Ge substrate, where the design is also compatible with epitaxial lift-off (ELO) or similar substrate reuse technologies (such as spalling, laser lift off, exfoliation, etc.). Moreover, the techniques described herein allow for growth of the single junction optoelectronic device in an inverted direction.

In an aspect, a method for fabricating a single-junction optoelectronic device. The method includes forming a p-n structure on a substrate, the p-n structure including a semiconductor having a lattice constant that matches a lattice constant of substrate, the semiconductor including a dilute nitride, and the single-junction optoelectronic device including the p-n structure. Moreover, the method includes separating the single junction optoelectronic device from the substrate.

The single-junction optoelectronic devices described herein with a single dilute nitride junction can be configured to also include a back reflector and/or other optical engineered structures or layers, which may be grown, deposited, or formed along with the p-n structure or subcell of the single-junction optoelectronic device. These optically engineered back side of the device allows for enhanced light absorption.

Additional aspects related to thin-film, flexible optoelectronic devices that incorporate a single lattice-matched dilute nitride junction and methods of fabricating these optoelectronic devices are also described.

BRIEF DESCRIPTION OF THE DRAWINGS

The appended drawings illustrate only some implementation and are therefore not to be considered limiting of scope.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

As described above, the present disclosure relates to optoelectronic devices that incorporate a single lattice-matched dilute nitride junction and the fabrication processes for forming such optoelectronic devices. Accordingly, the present disclosure describes various aspects of the fabrication of thin film devices, such as photovoltaic devices, light-emitting diodes (LEDs), or other optoelectronic devices, that can be used as the optoelectronic devices described herein.

It is desirable to improve the performance of an optoelectronic device such as a photovoltaic cell or an LED, for example, to improve the efficiency thereof without significantly affecting the cost or adding to overall size of the device. These devices should, therefore, be cost effective, easily implemented and/or adaptable to existing environments. Achieving better flexibility and lightweight designs are also highly desirable. The present disclosure describes various aspects of technical solutions that address such needs.

Generally, the performance of an optoelectronic device such as a photovoltaic cell (e.g., solar cell) or LEDs is improved by improving the light absorption/conversion efficiency of the cell or the light generation efficiency of the LED. High efficiency photovoltaic cells can be fabricated by growing materials with specific or targeted bandgaps or by growing materials with different bandgaps such that the highest band-gap material is on the light-facing side (e.g., front side) and the lowest bandgap material is on the opposite side (e.g., back side). This results in the absorption of photons with different energy by different layers, improving the efficiency of the photovoltaic cell since this arrangement results in more photons being absorbed and thus generating a larger current. By having a series combination of stacked solar cells (e.g., adjacent p-n structures or subcells), each can have the same current and their respective voltages are linearly added to give overall higher efficiency, and therefore, power. This can be achieved using different approaches (eg. Lattice-matched, mismatched, bonding etc.); however, each approach has its own advantages and disadvantages.

Growing a layer of a material with a specific bandgap or multiple layers of differing bandgap materials (i.e., materials having different energy gaps) may require materials of different lattice constant to achieve optimal bandgap combination. The lattice mismatch between the growth substrate and the different layers may lower the overall efficiency of the resulting photovoltaic cell (with similar inefficiencies arising in the operation of light-emitting diodes). Another approach is to grow lattice-mismatched optoelectronic devices (e.g., lattice-mismatched solar cells) using a metamorphic graded layer to allow for difference in lattice constants, for example, using InGaAs as the bottom junction. The metamorphic approach leads to a lot of wasted metalorganic chemical vapor deposition (MOCVD) precursor material and reduced MOCVD tool throughput, as well as bulkier and thicker devices.

For optoelectronic devices such as photovoltaic cells (e.g., solar cells) and LEDs, lattice-matched systems based on group III-V semiconductor materials that use standard alloys such as (AlGaIn)(PAsSb) do not allow to grow lattice-matched materials below the bandgap of GaAs (~1.41 eV). As described above, to increase the efficiency of optoelectronic devices, targeted junctions with specific bandgaps or multiple junctions with different bandgaps may be used to capture or collect energy from different parts of the spectrum. Therefore, in order to increase the solar cell efficiency for a specific target spectrum, the bandgap of the absorber material might require tunability, while maintaining lattice-matching with the GaAs or Ge substrate. This can be achieved by growing the metamorphic (or lattice-mismatched) junction on GaAs or Ge substrate using a compositionally graded buffer to bridge the lattice-constant. This approach, however, requires expensive and bulky metamorphic buffers.

Dilute nitride alloys or simply dilute nitrides (e.g., GaInAsN(Sb) alloys), can be grown lattice-matched to a GaAs substrate with their bandgap tunable below or at 1.4 eV to (e.g., 0.8 eV-1.4 eV). Therefore, dilute nitride alloys could allow lattice-matched solar cells of a single junction (1J) or p-n structure with bandgap tunability for a specific target spectrum and without the need for thick metamorphic graded buffers to bridge the latest constant of the desired absorber material with respect to the starting substrate. Furthermore, dilute nitrides as the bottom junction can also enable lattice-matched solar cells of beyond four (4) junctions or p-n structures on GaAs or Ge substrate with bandgaps of top three junction spanning in the range of 2.2 to 1.4 eV using (AlGaIn)(AsPSb). This approach is attractive for various reasons. For example, it is possible to epitaxially grow the entire stack or layers of the optoelectronic device lattice-matched and in the inverted direction to complement existing epitaxial lift off (ELO) processes. The proposed approach could enable lightweight and flexible optoelectronic devices (e.g., solar cells) without the need for thick and expensive metamorphic buffers.

Therefore, the present disclosure proposes the fabrication of optoelectronic devices with a single dilute nitride junction or p-n structure in an inverted direction and using a lift off process. P-n junctions within a p-n structure can be positioned close to the side where light is incident or further away towards the lower portion of the optoelectronic device using the dilute nitride material. That is, the position of the junction (the position of the p-n junction in each of the p-n structure) maybe formed near the front side of the device (light inside) or farther away from the incident side of the light (commonly referred as rear-heterojunction device). Each respective p-n structure could be a homojunction (that is, both sides of the junction in the p-n structure are comprised of the same material) or could be a heterojunction (that is, one side of the junction in the p-n structure may be comprised of a material of larger bandgap than the thick absorber/base layer). This approach enables the fabrication of thin-film optoelectronic devices that are lightweight and flexible and can provide high efficiencies by including a single dilute nitride junction. For example, the optoelectronic devices can be made flexible such that they can support a radius of curvature of 1 cm to 850 cm, for example. Moreover, these optoelectronic devices can be lightweight in that the can have a specific power (or energy density) 500 W/kg to 5000 W/kg, an areal energy density of 200 W/m$^2$ to 500 W/m$^2$, and an areal mass density (weight/area) of 0.05 kg/m$^2$ to 0.5 kg/m$^2$, for example. In addition, these optoelectronic devices support spectrum from AM0 to AM1.5.

The thin-film, flexible devices described herein (e.g., optoelectronic devices such as photovoltaic cells or LEDs) generally contain epitaxially grown layers which are formed on a release or sacrificial layer disposed on or over a support substrate or wafer. The thin film devices thus formed can be flexible single crystal devices. Once the thin film devices are formed by epitaxy processes, the thin film devices are subsequently removed or separated from the support substrate or wafer, for example during an epitaxial lift off (ELO) process, a laser lift off (LLO) process, or a spalling process, for example.

As used in this disclosure, a layer can be described as being deposited or grown "on" or "over" one or more other layers. This term indicates that the layer can be deposited or grown directly on top of the other layer(s), or can indicate that one or more additional layers can be deposited between the layer and the other layer(s) in some embodiments or implementations. Also, the other layer(s) can be arranged in any order. To describe the features of the present disclosure in more detail reference is made to the following discussion in conjunction with the accompanying figures.

Figure 1:
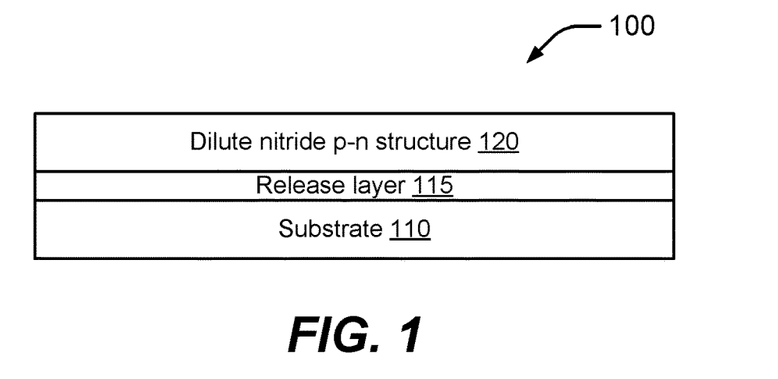
FIG. 1 is a diagram that illustrates an example of an optoelectronic device with a single dilute nitride junction in accordance with aspects of this disclosure.

FIG. 1 shows a diagram 100 that illustrates a general example of an optoelectronic device with a single junction or p-n structure (e.g., a 1J optoelectronic device) made of a dilute nitride. In this example, there is a substrate or wafer 110 on which a release layer 115 is disposed. Although the substrate 110 is shown as a single layer it may include multiple layers. The substrate 110 can be made of GaAs or Ge, for example.

The release layer 115, sometimes referred to as a sacrificial layer, may be provided to enable lift off or separation of the multi junction optoelectronic device from the substrate 100. In some implementations, the release layer 115 can be disposed on the substrate prior to deposition of the p-n structure, for example, to enable liftoff or separation of the p-n structure by using an epitaxial lift off (ELO) process or other similar process. The release layer 115 can comprise AlAs, AlGaAs, AlGaInP, or AlInP, or other layers with high Al content, or combinations thereof and is utilized to form a lattice structure for the various layers contained within the multi junction optoelectronic device, and then etched and removed during the ELO process. In other implementations, alternative liftoff processes such as laser lift off (LLO), ion implantation and liftoff, liftoff by etching of a buried oxide layer or a buried porous layer, or spalling can be used. The Al content in the release layer 115 can vary. For example, when the release layer 115 includes AlGaAs, the concentration can be $Al_xGa_{1-x}As$ (where x=1 to 0.3). In another example, when the release layer 115 includes AlGaInP, the concentration can be $(Al_xGa_{1-x})_{0.5}In_{0.5}P$ (where x=1 to 0).

The optoelectronic device is then grown, deposited, or formed (these terms could be used interchangeably) over the release layer 115. For example, the optoelectronic device in this example includes a single junction or p-n structure as described above. A dilute nitride p-n structure 120 is epitaxially grown on the release layer 115.

A p-n structure can refer to a structure having one or more semiconductor layers and where one or more p-n junctions are formed with the one or more semiconductor layers. Accordingly, each of the p-n structures in the multi junction optoelectronic device in the diagram 100a can include one or more p-n junctions. Moreover, each p-n structure in the optoelectronic device in the diagram 100a is lattice-matched to the substrate 110. That is, the lattice constants of the material(s) from which the p-n structure (e.g., the dilute nitride p-n structure 120) is made is the same as the lattice constant of the material from which the substrate is made. One of ordinary skill can recognize that such matching of lattice constants also includes materials with lattice constants nearly (substantially) matching each other. Matching or substantially matching of lattice constants refers to allowing two different and adjacent semiconductor materials a region of bandgap change to be formed without introducing a change in crystal structure. In an example, the lattice constant of the material or semiconductor of the dilute nitride p-n structure matches the lattice constant of the substrate 110 with a mismatch or strain of <0.4%.

The dilute nitride p-n structure 120 can be made of dilute nitride alloys such as GaInNAs or GaInNAsSb, more generally referred to as GaInAsN(Sb), or derivatives thereof. In one compositional example, the dilute nitride p-n structure 120 includes Ga1-yInyAs1-x-zNxSbz, where a concentration y of In is in the range of 0-20%, a concentration x of N is in the range of 0-6%, and a concentration z of Sb is in the range of 0-8%.

The dilute nitride p-n structure 120 can be formed by epitaxial growth using various techniques, for example, metalorganic chemical vapor deposition (MOCVD), molecular beam epitaxy (MBE), metalorganic vapor phase epitaxy (MOVPE or OMVPE), liquid phase epitaxy (LPE), hydride vapor phase epitaxy (HVPE), close-spaced vapor transport (CSVT) epitaxy, etc. In some implementations, the dilute nitride p-n structure 120 is substantially a single crystal. That is, the dilute nitride p-n structure 120 can include a single-crystalline semiconductor material.

In some implementations, the epitaxially grown layer or layers of dilute nitrides can be formed using a high growth rate process. The high growth rate process is such that grown materials are of sufficient quality for use in the types of optoelectronic devices described herein. The high growth rate process allows for growth rates of greater than 1 μm/hr, such as about 10 μm/hr or greater, or as high as about 100 μm/hr or greater. For example, the growth rates can be about 10 μm/hr, about 20 μm/hr, about 30 μm/hr, about 40 μm/hr, about 50 μm/hr, about 60 μm/hr, about 70 μm/hr, about 80 μm/hr, about 90 μm/hr, or about 100 μm/hr, some specific rate between any two of these values (e.g., about 25 μm/hr-between 20 μm/hr and 30 μm/hr), or some range between any two of these values (e.g., range from about 20 μm/hr to about 30 μm/hr). In some implementations, the high growth rate process allows for growth rates of greater than 100 μm/hr, including growth rates of about 120 μm/hr. The term "about" as used in this disclosure can indicate a variation of 1%, 2%, 3%, 4%, 5%, or 10%, for example, from a nominal value.

In some implementations, the dilute nitride p-n structure 120 can have interface or intermediate layers formed between an emitter layer and a base layer (e.g., between emitter and base layers in a p-n junction or a p-n structure). The intermediate layer can be n-doped, p-doped, or not intentionally doped. The thickness of the intermediate layer can be in the range of about 5 nm to about 3000 nm, for example. The intermediate layer is located between a p-doped layer and an n-doped layer, and can be comprised of the same material as either the n-doped layer or the p-doped layer, or can be comprised of a different material from either the n-doped layer or the p-doped layer, and/or can a layer of a graded composition. The intermediate layer thus formed can provide a location offset for one or more heterojunctions from a corresponding p-n junction. Such an offset can allow for reduced dark current within the device, improving its performance.

Within the dilute nitride p-n structure 120, heterostructures may be formed that include a combination of alloys comprising AlGaAs/GaInAsN(Sb) or AlGaInP/GaInAsN(Sb). The position of the heterojunction within the heterostructures can be closer to the incident sunlight side or away towards the rear side of the device.

The processes for forming the dilute nitride p-n structure 120, as described herein, can be conducted in various types of deposition chambers. For example, one continuous feed deposition chamber that can be utilized for growing, depositing, or otherwise forming dilute nitrides.

Figure 2A:
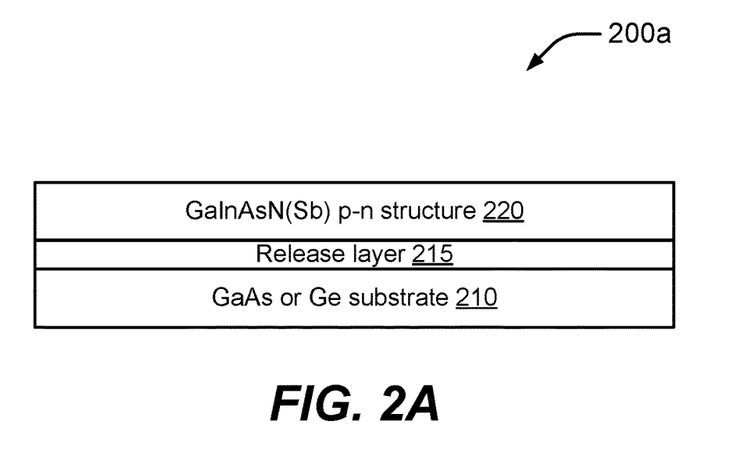
FIG. 2A is a diagram that illustrates a specific example of an optoelectronic device with a single dilute nitride junction in accordance with aspects of this disclosure.

FIG. 2A shows a diagram 200a that illustrates a specific example of an optoelectronic device with a single dilute nitride junction in accordance with aspects of this disclosure.

In a first example, the optoelectronic device in FIG. 2A includes a substrate that is made of GaAs or Ge (referred to as the GaAs or Ge substrate 210 in the diagram 200a), a release layer 215 substantially similar to the release layer 115 described above, and a single p-n structure that is made of a dilute nitride with a bandgap of approximately 0.9-1.4 eV, more specifically 1.1 eV-1.35 eV (referred to as a GaInAsN(Sb) p-n structure 220).

In a second example, the optoelectronic device in FIG. 2A includes the GaAs or Ge substrate 210, the release layer 215, and the GaInAsN(Sb) p-n structure 220 made of a dilute nitride with a bandgap of approximately 1.3 eV-1.4 eV.

In a third example, the optoelectronic device in FIG. 2A includes the GaAs or Ge substrate 210, the release layer 215, and the GaInAsN(Sb) p-n structure 220 made of a dilute nitride with a bandgap of approximately 1.34 eV.

In a fourth example, the optoelectronic device in FIG. 2A includes the GaAs or Ge substrate 210, the release layer 215, and the GaInAsN(Sb) p-n structure 220 made of a dilute nitride with a bandgap of approximately 0.9 eV-1.4 eV.

Figure 2B:
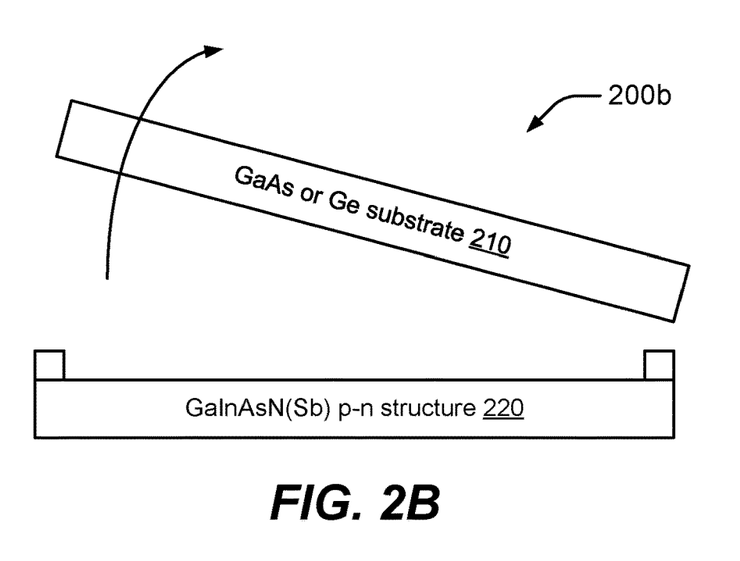
FIG. 2B is a diagram that illustrates an example of separation of the optotelectronic device in FIG. 2A from a substrate in accordance with aspects of this disclosure.

FIG. 2B shows a diagram 200b that illustrates a separation of the optoelectronic device in FIG. 2A from the substrate 210 using any of different lift off techniques described herein, including an ELO process, for example. The diagram 200b shows the GaAs or Ge substrate 210 being removed or separated from the optoelectronic device, leaving at least the GaInAsN(Sb) p-n structure 220 left.

Figure 3:
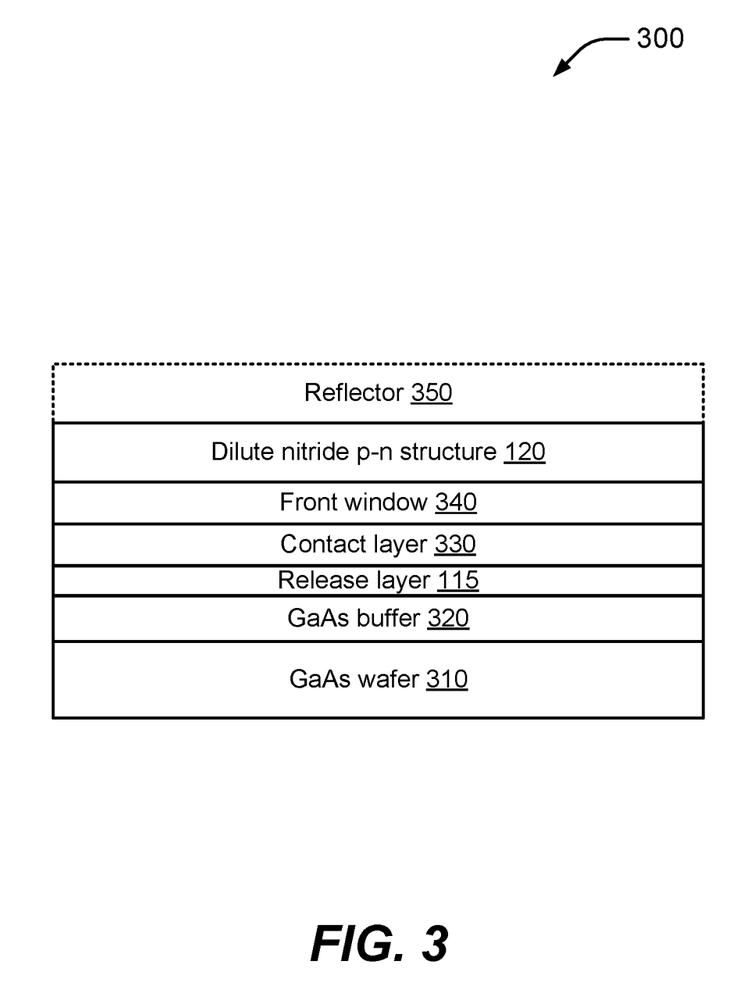
FIGS. 3, 4, and 5 are diagrams that illustrate examples of an optoelectronic device with a single dilute nitride junction in accordance with aspects of this disclosure.

FIG. 3 shows a diagram 300 that illustrates another general example of an optoelectronic device. In this example, there is a GaAs wafer 310 that corresponds to the substrate 110 when made of GaAs. A GaAs buffer 320 is disposed on the GaAs wafer 310, and the release layer 115 is disposed on the GaAs buffer 320. A contact layer 330 is formed on the release layer 115 and a front window 340 is formed on the contact layer 330.

The contact layer 330 can be heavily n-doped. In some implementations, the doping concentration can be within a range greater than about $5 \times 10^{18}$ cm$^{-3}$, for example, from greater than about $5 \times 10^{18}$ cm$^{-3}$ to about $5 \times 10^{18}$ cm$^{-3}$. The high doping of the contact layer 330 allows an ohmic contact to be formed with a later-deposited metal layer without any annealing step performed to form such an ohmic contact.

The contact layer 330 can be GaAs doped with silicon (Si). For example, in some implementations in which a high-growth rate, as described above, is used to form the layers of the multi junction optoelectronic device, a silicon dopant (as an n-dopant) can be used to bring the doping concentration to $5 \times 10^{18}$ cm$^{-3}$ or greater. For example, a precursor disilane can be introduced in a fast growth rate process to deposit the silicon dopant. In other implementations, selenium (Se) or tellurium (Te) can be used as a dopant in the formation of at least some of the layers of multi junction optoelectronic device.

In the example shown in the diagram 300, the contact layer 330 is clearly formed before the optoelectronic device is removed or separated from the GaAs wafer 310 and the GaAs buffer 320. The remaining portions of the structure shown include the same or similar layers as described above in connection with FIG. 1. For example, the dilute nitride p-n structure 120 is formed on the front window 340. Optionally, a reflector 350 (also referred to as a back reflector) can be formed on the dilute nitride p-n structure 120.

A support layer (not shown) can be deposited on the last grown p-n structure either before or after the optoelectronic device is separated from the GaAs wafer 310. When deposited before the separation, the optoelectronic device and the support layer can be lifted off (e.g., separated, removed) together from the GaAs wafer 310 and the GaAs buffer 320.

The support layer can include one or more of a dielectric layer, a semiconductor contact layer (or simply contact layer), a passivation layer, a transparent conductive oxide layer, an anti-reflective coating, a metal coating, an adhesive layer, an epoxy layer, or a plastic coating. In an embodiment or implementation, the support layer is composed of one or more materials that have a chemical resistance to acids, for example, to acids that are used as part of a liftoff process (e.g., ELO). In those instances in which a dielectric layer is included as part of a support layer, the dielectric layer includes dielectric materials that are organic or inorganic. The organic dielectric materials comprise any of polyolefin, polycarbonate, polyester, epoxy, fluoropolymer, derivatives thereof and combinations thereof and the inorganic dielectric materials comprise any of arsenic trisulfide, arsenic selenide, a alumina (sapphire), magnesium fluoride, derivatives thereof and combinations thereof. In those instances in which a contact layer (or multiple contact layers) is included as part of a support layer, the contact layer can contain group III-V semiconductor materials, such as AlGaAs, depending on the desired composition of the final optoelectronic device.

Figure 4:
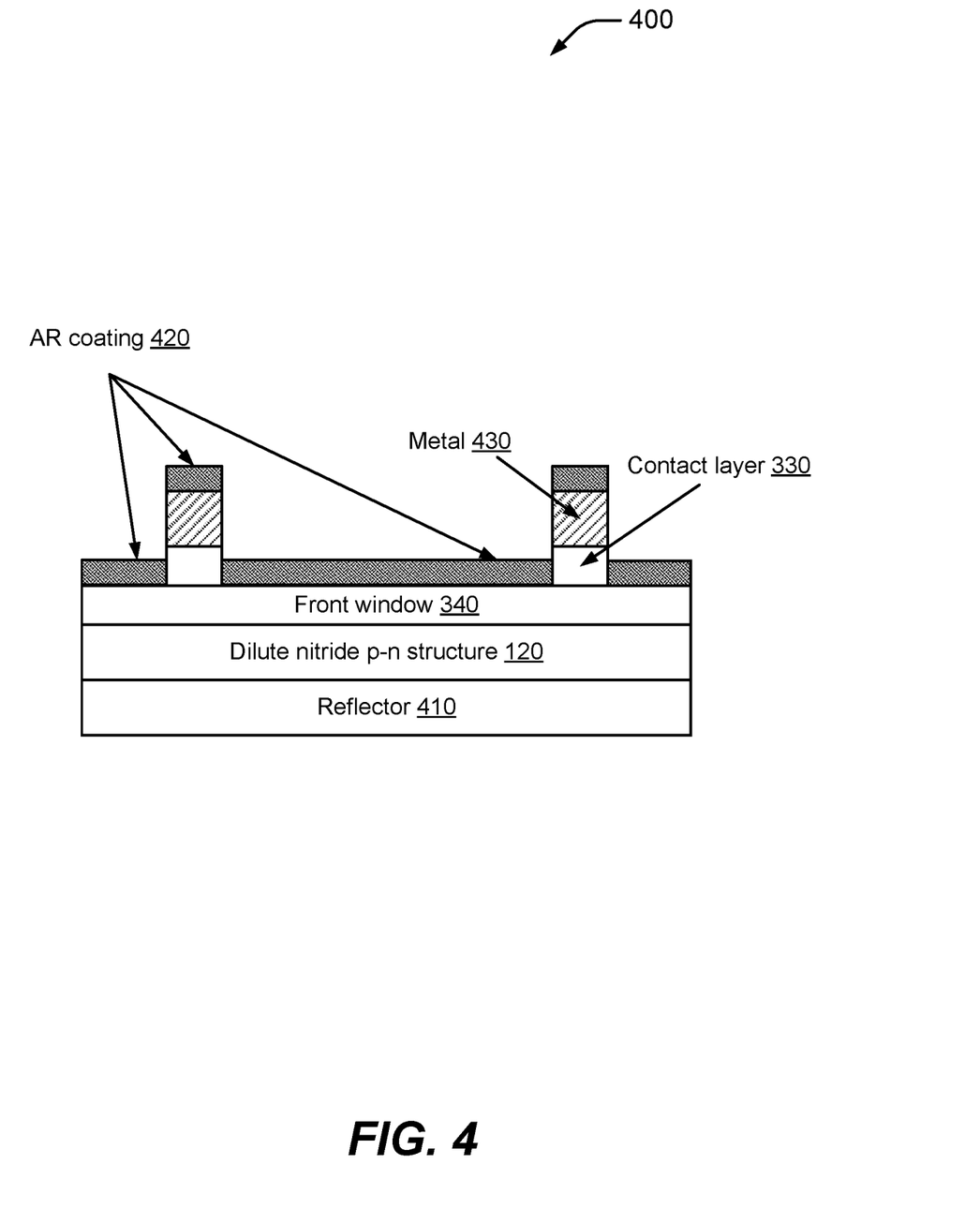

FIG. 4 shows a diagram 400 that illustrates the optoelectronic device in FIG. 3 after being separated from the GaAs wafer 310 and the GaAs buffer 320. In the diagram 400, the optoelectronic device is shown sunny side up with a reflector 410 added on the back side and metal 430 and an anti-reflecting (AR) coating 420 added to the front side.

The reflector 410, which can also be referred to as reflective back contact, is a metallic reflector or a metal-dielectric reflector. The reflector 410 can correspond to the reflector 350 shown in FIG. 3. These reflective back contact can be deposited either before or after the multi junction optoelectronic device is lifted off and can comprise one or more of silver, aluminum, gold, platinum, copper, nickel, molybdenum, or alloys thereof. The layer with the reflective back contact can be deposited by a vapor deposition process, such as physical vapor deposition (PVD), sputtering, electron beam deposition (e-beam), ALD, CVD, PE-ALD, or PE-CVD, or by other deposition processes including inkjet printing, screen printing, evaporation, electroplating, electroless deposition (e-less), or combinations thereof.

Figure 5:
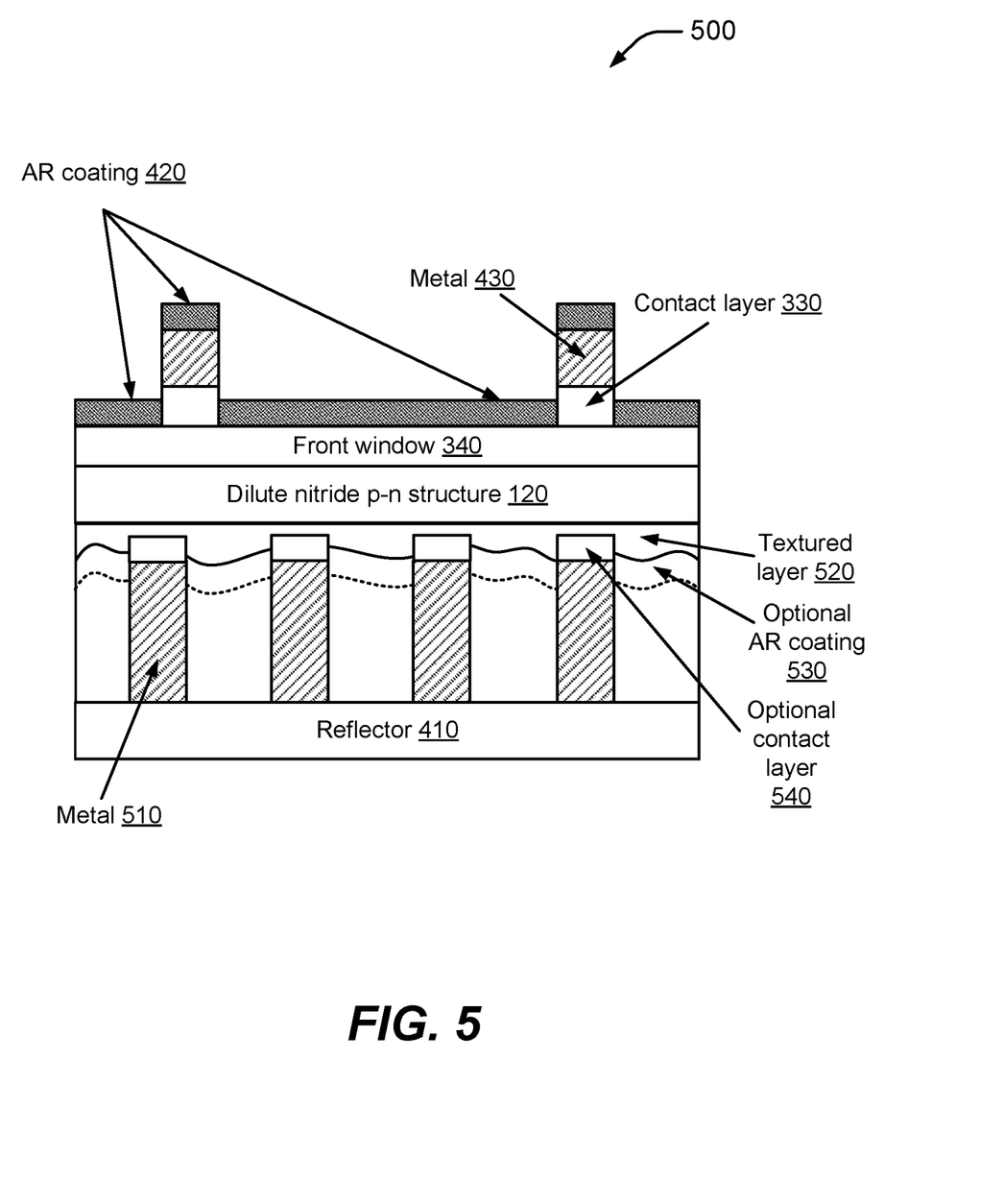

FIG. 5 shows a diagram 500 that illustrates the multi junction optoelectronic device in FIG. 4 including the reflector 410 added on the back side and the metal 430 and the AR coating 420 added to the front side. In addition, between the reflector 410 and the dilute nitride p-n structure 120, there is a textured layer 520, an optional AR coating 530 adjacent to the textured layer 520, one or more metals 510 in contact with the reflector 410, and optionally a contact layer 540 at the end of the one or more metals 510. Surface texturing, as provided by the textured layer 520 and/or the adjacent optional AR coating 530, can improve the scattering of light at that surface, as well as improve adhesion to both metal and dielectric layers.

Texturing associated with the optoelectronic device need not be limited to the textured layer 520 and/or the optional adjacent AR coating 530. The texturing of a surface can be achieved during the growth of the materials that comprise a p-n structure. This can be achieved at least in part by using a lattice mismatch between at least two materials in the p-n structure, for example in a Stranski-Krastanov process or a Volmer-Weber process, to produce texturing at the interface between the materials. In another implementation, a layer in or on the p-n structure can act as an etch mask and texturing can be provided by an etching process. In yet another implementation, texturing can be provided by physical abrasion such as sandpaper or sandblasting or particle blasting or similar processes. In yet another implementation, texturing can be provided by an inhomogeneous etching process that produces microscopically non-uniform features on a surface. Moreover, texturing can be accomplished using techniques similar to those used in silicon texturing, including, for example, "random pyramid" or "inverted pyramid" etching using, for example, KOH.

The back side (as in this example) and/or the front side (e.g., the side closest to where light is received by a photovoltaic cell or emitted by an LED) of the p-n structure can be textured to improve light scattering into and/or out of the device. In back-side texturing as shown in FIG. 5, the dilute nitride materials can be textured using one or more of the texturing techniques described above.

Figure 6:
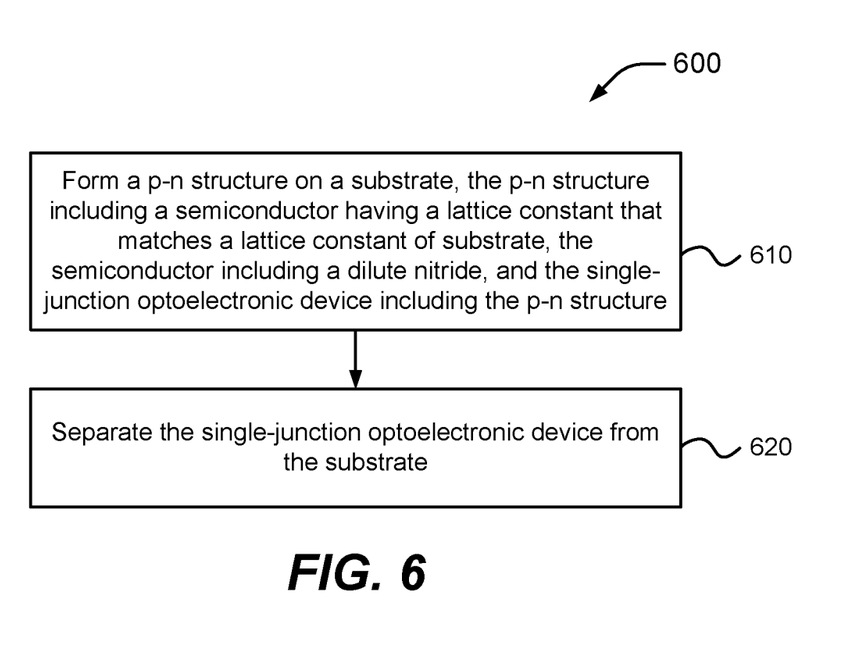
FIG. 6 is a flow chart that illustrate an example of a method for fabricating an optoelectronic device with a single dilute nitride junction in accordance with aspects of this disclosure.

FIG. 6 is a flow chart that illustrates a method 600 for fabricating a single-junction optoelectronic in accordance with aspects of this disclosure.

At block 610, the method 600 includes forming a p-n structure on a substrate (e.g., the substrate 110), the p-n structure including a semiconductor having a lattice constant that matches a lattice constant of substrate, the semiconductor including a dilute nitride (e.g., the dilute nitride p-n structure 120), and the single-junction optoelectronic device including the p-n structure. The substrate is made of or includes one of GaAs or Ge.

At block 620, the method 600 includes separating the single-junction optoelectronic device from the substrate.

In an aspect of the method 600, separating the single junction optoelectronic device from the substrate includes orienting the single-junction optoelectronic device such that the p-n structure is nearest to a surface of the single junction optoelectronic device upon which light is to be incident.

In an aspect of the method 600, the method further includes forming, as part of backside processing, additional layers on a surface of the single junction optoelectronic device nearest the p-n structure.

In an aspect of the method 600, the method further includes providing, for the single-junction optoelectronic device, a support layer having one or more of a dielectric layer, a semiconductor contact layer, a passivation layer, a transparent conductive oxide layer, an anti-reflective coating, a metal coating, an adhesive layer, an epoxy layer, or a plastic coating.

In an aspect of the method 600, the dilute nitride includes one or more of GaInNAs, GaInNAsSb, alloys thereof, or derivatives thereof. In a compositional example, the dilute nitride includes $Ga_{1-y}In_yAs_{1-x-z}N_xSb_z$, where a concentration y of In is in the range of 0-20%, a concentration x of N is in the range of 0-6%, and a concentration z of Sb is in the range of 0-8%.

In an aspect of the method 600, the lattice constant of the semiconductor matches the lattice constant of the substrate with a mismatch or strain of <0.4%.

In an aspect of the method 600, forming the p-n structure on the substrate includes depositing the p-n structure using an epitaxial growth process. In an example, the epitaxial growth process is a molecular beam epitaxy (MBE) process. The epitaxial growth process can include one or more of: a metalorganic chemical vapor deposition (MOCVD) process, a hydride vapor phase epitaxy (HVPE) process, a molecular beam epitaxy (MBE) process, a metalorganic vapor phase epitaxy (MOVPE or OMVPE) process, a liquid phase epitaxy (LPE) process, a close-space vapor transport (CSVT) epitaxy process, a plasma enhanced chemical vapor deposition (PECVD) process, a physical vapor deposition (PVD) process, an atmospheric pressure chemical vapor deposition (APCVD) process, an atomic layer deposition (ALD) process, a low pressure chemical vapor deposition (LPCVD) process, a hot-wire chemical vapor deposition (HWCVD) process, an inductively coupled plasma enhanced chemical vapor deposition (ICP-CVD) process, or other forms of CVD.

In an aspect of the method 600, separating the single junction optoelectronic device from the substrate includes performing an epitaxial liftoff (ELO) process for lifting the single-junction optoelectronic device off the substrate.

In an aspect of the method 600, the method further includes providing a release layer (see e.g., the release layer 115) between the substrate and the p-n structure, where separating the single junction optoelectronic device from the substrate includes removing the sacrificial layer. In an example, the release layer includes AlAs.

In an aspect of the method 600, the release layer includes AlGaAs, the concentration is $Al_xGa_{1-x}As$, where x=1 to 0.3.

In an aspect of the method 600, the release layer includes AlGaInP, the concentration is $(Al_xGa_{1-x})_{0.5}In_{0.5}P$, where x=1 to 0.

In an aspect of the method 600, the substrate includes GaAs or Ge, and the dilute nitride has a bandgap of approximately 1.1 eV-1.35 eV (see e.g., FIG. 2A).

In an aspect of the method 600, the substrate includes GaAs or Ge, and the dilute nitride has a bandgap of approximately 1.3 eV-1.4 eV (see e.g., FIG. 2A).

In an aspect of the method 600, the substrate includes GaAs or Ge, and the dilute nitride has a bandgap of approximately 1.34 eV (see e.g., FIG. 2A).

In an aspect of the method 600, the substrate includes GaAs or Ge, and the dilute nitride has a bandgap of approximately 0.9 eV-1.4 eV (see e.g., FIG. 2A).

In an aspect of the method 600, the method further includes forming a reflector on the p-n structure, and separating the single junction optoelectronic device from the substrate includes separating the p-n structure and the reflector from the substrate.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A method for fabricating a single-junction solar cell, comprising:
   providing a substrate;
   forming a release layer on the substrate;
   epitaxially growing a dilute nitride single p-n structure on the release layer, the dilute nitride single p-n structure having a lattice constant that matches a lattice constant of the substrate, the dilute nitride single p-n structure including a single-crystalline semiconductor material, wherein the dilute nitride single p-n structure forms the single-junction solar cell; and
   separating the single-junction solar cell from the substrate by removing the release layer.

2. The method of claim 1, wherein separating the single-junction solar cell from the substrate includes orienting the single-junction solar cell such that the dilute nitride single p-n structure is nearest to a surface of the single junction solar cell upon which light is to be incident.

3. The method of claim 1, further comprising forming, as part of backside processing, additional layers on a surface of the single-junction solar cell, wherein the additional layers include a reflector and one or more layers between the reflector and the dilute nitride single p-n structure.

4. The method of claim 1, further comprising providing, for the single-junction solar cell, a support layer having one or more of a dielectric layer, a semiconductor contact layer, a passivation layer, a transparent conductive oxide layer, an anti-reflective coating, an adhesive layer, an epoxy layer, or a plastic coating, wherein the support layer is deposited on the dilute nitride single p-n structure before the single-junction solar cell is separated from the substrate.

5. The method of claim 1, wherein the substrate includes one of GaAs or Ge.

6. The method of claim 1, wherein the dilute nitride single p-n structure includes one or more of GaInNAs, GaInNAsSb, alloys thereof, or derivatives thereof.

7. The method of claim 1, wherein:
the dilute nitride single p-n structure includes $Ga_{1-y}In_yAs_{1-x-z}N_xSb_z$,
a concentration y of In is in the range of 0-20%,
a concentration x of N is in the range of 0-6%, and
a concentration z of Sb is in the range of 0-8%.

8. The method of claim 1, wherein the lattice constant of the dilute nitride single p-n structure matches the lattice constant of the substrate with a mismatch or strain of <0.4%.

9. The method of claim 1, wherein an epitaxial growth process for forming the dilute nitride single p-n structure is a molecular beam epitaxy (MBE) process.

10. The method of claim 1, wherein an epitaxial growth process for forming the dilute nitride single p-n structure includes one or more of:
  a metalorganic chemical vapor deposition (MOCVD) process,
  a hydride vapor phase epitaxy (HVPE) process,
  a molecular beam epitaxy (MBE) process,
  a metalorganic vapor phase epitaxy (MOVPE or OMVPE) process,
  a liquid phase epitaxy (LPE) process,
  a close-space vapor transport (CSVT) epitaxy process,
  a plasma enhanced chemical vapor deposition (PECVD) process,
  a physical vapor deposition (PVD) process,
  an atmospheric pressure chemical vapor deposition (AP-CVD) process,
  an atomic layer deposition (ALD) process,
  a low pressure chemical vapor deposition (LPCVD) process,
  a hot-wire chemical vapor deposition (HWCVD) process,
  an inductively coupled plasma enhanced chemical vapor deposition (ICP-CVD) process, or
  other forms of CVD.

11. The method of claim 1, wherein an epitaxial growth process for forming the dilute nitride single p-n structure includes a combination of MBE and MOCVD.

12. The method of claim 1, wherein separating the single-junction solar cell from the substrate includes performing an epitaxial liftoff (ELO) process for lifting the single-junction solar cell off the substrate.

13. The method of claim 1, wherein the release layer includes AlAs.

14. The method of claim 1, wherein the release layer includes AlGaAs having a concentration of $Al_xGa_{1-x}As$, where x=1 to 0.3.

15. The method of claim 1, wherein the release layer includes AlGaInP having a concentration of $(Al_xGa_{1-x})_{0.5}In_{0.5}P$, where x=1 to 0.

16. The method of claim 1, wherein:
the substrate includes GaAs or Ge, and
the dilute nitride single p-n structure has a bandgap of approximately 1.1 eV-1.35 eV.

17. The method of claim 1, wherein:
the substrate includes GaAs or Ge, and
the dilute nitride single p-n structure has a bandgap of approximately 1.3 eV-1.4 eV.

18. The method of claim 1, wherein:
the substrate includes GaAs or Ge, and
the dilute nitride single p-n structure has a bandgap of approximately 1.34 eV.

19. The method of claim 1, wherein:
the substrate includes GaAs or Ge, and
the dilute nitride single p-n structure has a bandgap of approximately 0.9 eV-1.4 eV.

20. The method of claim 1, further comprising:
forming a reflector on the dilute nitride single p-n structure, and
separating the single-junction solar cell from the substrate includes separating the dilute nitride single p-n structure and the reflector from the substrate.

21. The method of claim 1, wherein the dilute nitride single p-n structure includes a p-n junction, a position of the p-n junction within the dilute nitride single p-n structure being near a front side of the single-junction solar cell.

22. The method of claim 1, wherein the dilute nitride single p-n structure is a heterojunction.

23. The method of claim 1, wherein the dilute nitride single p-n structure includes a p-n junction, a position of the p-n junction within the dilute nitride single p-n structure being away from a incident side of a light of the single-junction solar cell.

24. The method of claim 1, wherein the dilute nitride single p-n structure is a homojunction.

* * * * *